(12) United States Patent
Kasai et al.

(10) Patent No.: US 11,221,358 B2
(45) Date of Patent: Jan. 11, 2022

(54) PLACEMENT STAND AND ELECTRONIC DEVICE INSPECTING APPARATUS

(71) Applicant: TOKYO ELECTRON LIMITED, Tokyo (JP)

(72) Inventors: Shigeru Kasai, Nirasaki (JP); Yoshinori Fujisawa, Tokyo (JP)

(73) Assignee: TOKYO ELECTRON LIMITED, Tokyo (JP)

(*) Notice: Subject to any disclaimer, the term of this patent is extended or adjusted under 35 U.S.C. 154(b) by 229 days.

(21) Appl. No.: 16/464,174

(22) PCT Filed: Sep. 29, 2017

(86) PCT No.: PCT/JP2017/036400
§ 371 (c)(1),
(2) Date: May 24, 2019

(87) PCT Pub. No.: WO2018/100881
PCT Pub. Date: Jun. 7, 2018

(65) Prior Publication Data
US 2021/0102991 A1    Apr. 8, 2021

(30) Foreign Application Priority Data

Mar. 21, 2017 (JP) .............................. JP2017-054366
Jul. 11, 2017 (JP) .............................. JP2017-135401

(51) Int. Cl.
*G01R 31/26* (2020.01)
*G01R 1/067* (2006.01)
(Continued)

(52) U.S. Cl.
CPC ...... *G01R 31/2601* (2013.01); *G01R 1/06711* (2013.01); *G01R 31/2635* (2013.01);
(Continued)

(58) Field of Classification Search
CPC ............ G01R 31/2601; G01R 31/2619; G01R 31/2635; G01R 31/2637; G01R 31/2863;
(Continued)

(56) References Cited

U.S. PATENT DOCUMENTS 9,797,942 B2 * 10/2017 Engberg .................. G01J 5/522
2005/0035311 A1 * 2/2005 Asakawa .............. G02F 1/1309
250/559.16
(Continued)

FOREIGN PATENT DOCUMENTS

JP    H7-199141 A    8/1995
JP    H7-297242 A    11/1995
(Continued)

*Primary Examiner* — Amy He
(74) *Attorney, Agent, or Firm* — Nath, Goldberg & Meyer; Jerald L. Meyer; Tanya E. Harkins

(57) ABSTRACT

Provided is an electronic device inspection apparatus that suppresses cost increase. A prober is provided with a stage on which a carrier or a wafer is placed. The stage is provided with a stage cover on which the carrier is placed, a cooling unit in contact with the stage cover, and an LED irradiation unit facing the carrier across the stage cover and the cooling unit. Each of the stage cover and the cooling unit is formed of light-transmitting material. A light-transmitting coolant flows in a coolant flow path in the cooling unit. The LED irradiation unit has a plurality of LEDs oriented to the carrier. The carrier is formed of a glass substrate having a substantially disk-like shape. A plurality of electronic devices is arranged on a surface of the carrier at predetermined intervals.

15 Claims, 13 Drawing Sheets

(51) Int. Cl.
*G01R 31/28* (2006.01)
*G01R 1/04* (2006.01)

(52) U.S. Cl.
CPC ..... *G01R 31/2875* (2013.01); *G01R 31/2877* (2013.01); *G01R 1/0416* (2013.01)

(58) Field of Classification Search
CPC ............ G01R 31/2875; G01R 31/2877; G01R 31/2886; G01R 31/2642; G01R 31/06711; G01R 31/0416; G01R 31/2856
See application file for complete search history.

(56) References Cited

U.S. PATENT DOCUMENTS

| | | | |
|---|---|---|---|
| 2008/0042679 A1* | 2/2008 | van de Beek | G01R 31/2874 324/750.08 |
| 2012/0328273 A1 | 12/2012 | Kawano et al. | |
| 2015/0075748 A1 | 3/2015 | Suzuki et al. | |
| 2018/0047593 A1* | 2/2018 | Mui | H01L 21/67115 |
| 2018/0261486 A1* | 9/2018 | Anada | H01L 21/6831 |

FOREIGN PATENT DOCUMENTS

| | | |
|---|---|---|
| JP | 2002-359289 A | 12/2002 |
| JP | 2005-302855 A | 10/2005 |
| JP | 2006-138711 A | 6/2006 |
| JP | 2009-130114 A | 6/2009 |
| JP | 2013-65823 A | 4/2013 |
| JP | 2015-56624 A | 3/2015 |
| KR | 10-2013-0000340 A | 1/2013 |
| KR | 10-2014-0121911 A | 10/2014 |

\* cited by examiner

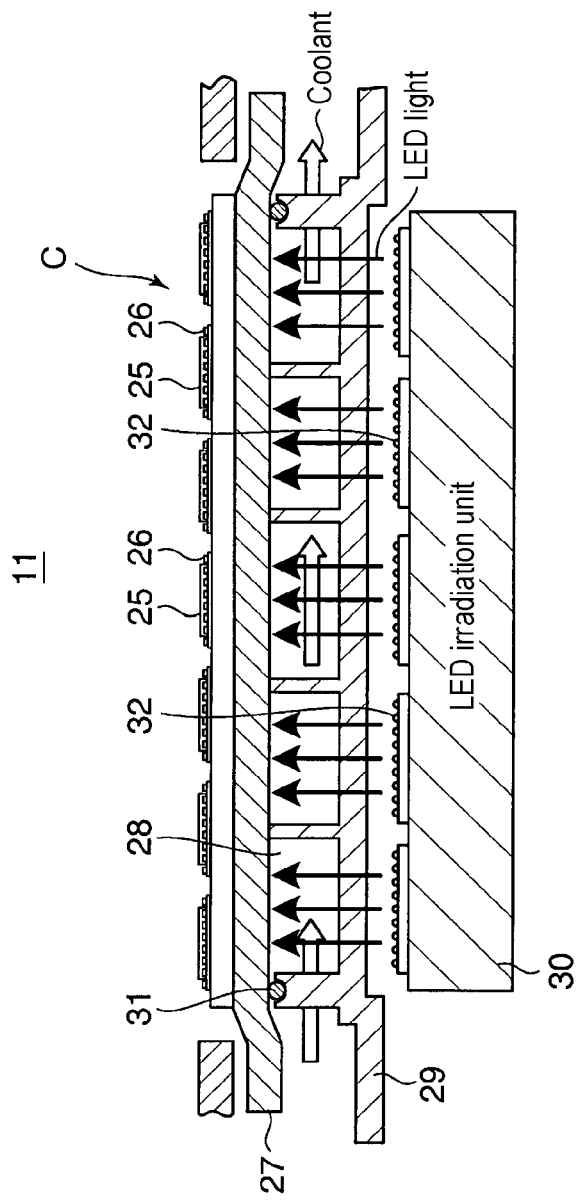

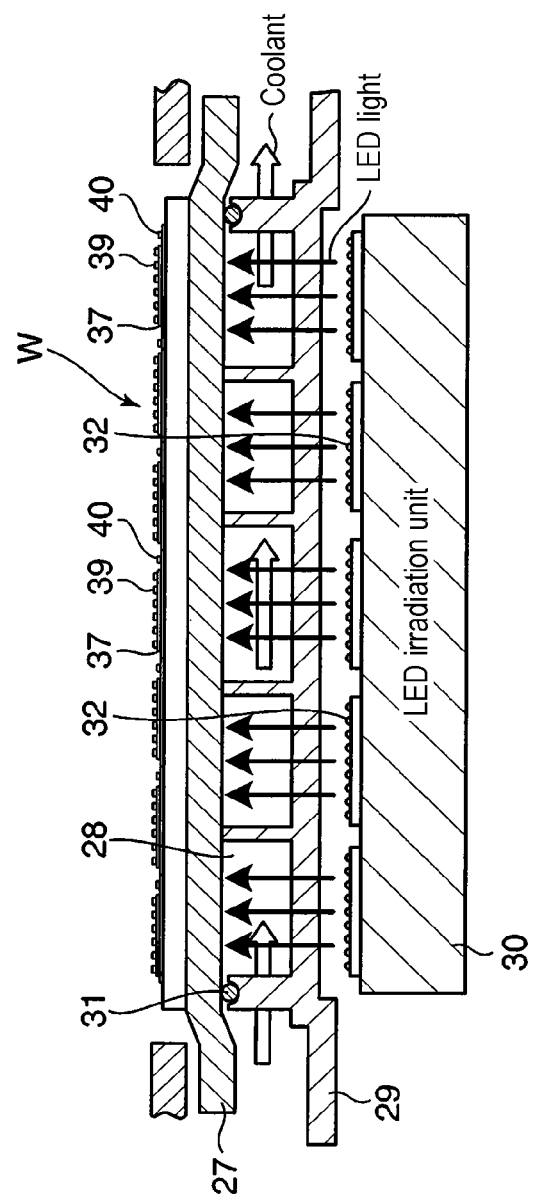

PLACEMENT STAND AND ELECTRONIC DEVICE INSPECTING APPARATUS

This is a National Phase Application filed under 35 U.S.C. 371 as a national stage of PCT/JP2017/036400, filed Sep. 29, 2017, an application claiming the benefit of Japanese Application No. 2017-135401, filed Jul. 11, 2017, Japanese Application No. 2017-054366, filed Mar. 21, 2017 and Japanese Application No. 2016-231844, filed Nov. 29, 2016 the content of each of which is hereby incorporated by reference in its entirety.

TECHNICAL FIELD

The present disclosure relates to a placement stand on which a substrate having electronic devices formed in the substrate or a carrier having electronic devices arranged on the carrier is placed, and an electronic device inspection apparatus including the placement stand.

BACKGROUND

For the purposes of detecting a defect or the like in a manufacturing process of an electronic device, a prober was developed as an electronic device inspection apparatus for inspecting an electronic device. The prober inspects an electronic device which is formed on a semiconductor wafer (hereinafter, simply referred to as a "wafer") as a substrate, or is cut out from a wafer and disposed on a plate-shaped carrier.

The prober includes a probe card having a plurality of pin-shaped probes, a stage on which a wafer or a carrier is placed, and an IC tester. Electrical characteristics of an electronic device are inspected by bringing the probes of the probe card into contact with an electrode pad or a solder bump installed correspondingly to an electrode of the electronic device and transmitting a signal from the electronic device to the IC tester (see, for example, Patent Document 1). When inspecting the electrical characteristics of the electronic device using the prober, the temperature of the wafer is controlled by a coolant flow path or a heater disposed in the stage, so that an implementation environment of the electronic device is emulated.

With the development of high-speed and small-sized electronic devices in recent years, the degree of integration is increased and the amount of heat generated by the electronic devices in operation is significantly increased. Thus, during inspection of one electronic device in a wafer or a carrier, a thermal load may be applied to other adjacent electronic devices, which may cause trouble in the other electronic devices. Therefore, it is preferable to suppress the application of the thermal load to the other electronic devices by controlling a temperature of the electronic device under inspection using a coolant flow path or a heater.

PRIOR ART DOCUMENTS

Patent Documents

Patent Document 1: Japanese Laid-Open Patent Publication No. H7-297242

SUMMARY

However, since it is difficult to miniaturize a coolant flow path or a heater, it is difficult to dispose the coolant flow path or the heater locally in the stage. That is to say, while the coolant flow path or the heater disposed in the stage allows a temperature control of the entirety of the wafer, it is hard to control the temperature of the wafer locally, for example, only in the vicinity of the electronic device under inspection. Thus, application of a thermal load to other adjacent electronic devices is avoided by not applying a relatively high implementation voltage, which is to be applied in the implementation environment, to the electronic device under inspection. However, the above-described method makes it hard to find a problem that may occur when the implementation voltage is applied until the electronic device is packaged, which results in a decrease in the yield of the package and causes an increase in cost.

The present disclosure provides a placement stand and an electronic device inspection apparatus that can suppress cost increase.

The present disclosure provides a placement stand including a cooling mechanism on which an inspection object is placed, and a light irradiation mechanism disposed to face the inspection object across the cooling mechanism. The cooling mechanism is formed of light-transmitting material, and a coolant transmitting light flows in the cooling mechanism. The light irradiation mechanism includes a plurality of LEDs oriented to the inspection object. Irradiation and non-irradiation of the plurality of LEDs is partially controlled to irradiate light to an arbitrary location in the inspection object such that the arbitrary location in the inspection object is heated while the entirety of the inspection object is cooled by the cooling mechanism.

The present disclosure provides an electronic device inspection apparatus for inspecting an electronic device disposed on or formed on an inspection object. The electronic device inspection apparatus includes a placement stand on which the inspection object is placed, and a contact terminal in electrical contact with the electronic device of the inspection object placed on the placement stand. The placement stand includes a cooling mechanism on which the inspection object is placed, and a light irradiation mechanism disposed to face the inspection object across from the cooling mechanism. The cooling mechanism is formed of light-transmitting material, and a coolant transmitting light flows in the cooling mechanism. The light irradiation mechanism includes a plurality of LEDs oriented to the inspection object. Irradiation and non-irradiation of the plurality of LEDs is partially controlled to irradiate light to an arbitrary location in the inspection object such that the arbitrary location in the inspection object is heated while the entirety of the inspection object is cooled by the cooling mechanism.

According to the present disclosure, a light irradiation mechanism having a plurality of LEDs is disposed to face an inspection object across from a cooling mechanism through which a coolant flows. Since the cooling mechanism is formed of light-transmitting material and the coolant also transmits light, the light from the LEDs can pass through the cooling mechanism and the coolant and reach the inspection object. In addition, the light irradiation mechanism can irradiate light to an arbitrary location in the inspection object by the respective LEDs. This makes it possible to irradiate light to the arbitrary location in the inspection object while cooling the entirety of the inspection object by the cooling mechanism. Thus, it is possible to heat a desired electronic device only in the inspection object. That is to say, since it is possible to cool the other electronic devices in the inspection object while controlling the temperature of the desired electronic device only, a thermal load from the desired electronic device can be suppressed from being applied to the other electronic devices. As a result, it is possible to apply a relatively high implementation voltage, which is to be applied in the implementation environment, to the desired electronic device, so that troubles that may occur when the implementation voltage is applied can be found before packaging the electronic device. Thus, it is possible to prevent cost increase by suppressing deterioration of the yield of packages.

BRIEF DESCRIPTION OF THE DRAWINGS

FIG. 4 is a sectional view schematically illustrating a configuration of an upper portion of a stage in FIG. 1.

FIG. 8 is a sectional view for explaining a state where a wafer W is placed on a stage according to the second embodiment.

DETAILED DESCRIPTION

Hereinafter, embodiments of the present disclosure will be described with reference to the drawings.

First, a first embodiment of the present disclosure will be described.

Figure 1:
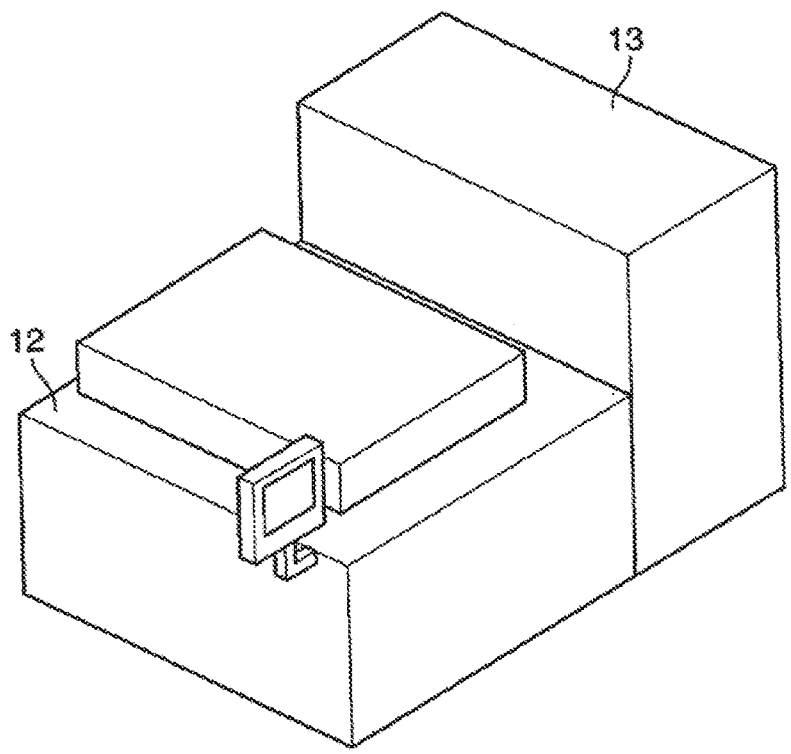
FIG. 1 is a perspective view for schematically explaining a configuration of a prober as an electronic device inspection apparatus according to a first embodiment of the present disclosure.
Figure 2:
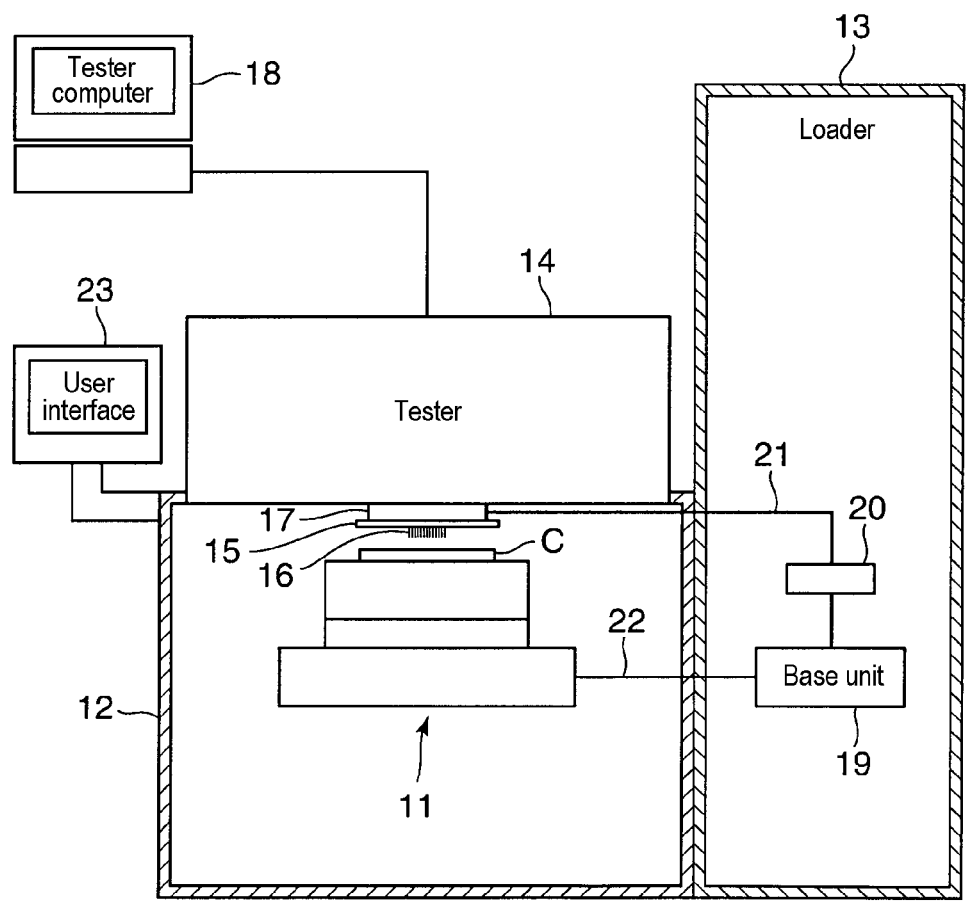
FIG. 2 is a front view for schematically explaining a configuration of the prober as the electronic device inspection apparatus according to the present embodiment.

FIG. 1 is a perspective view for schematically explaining a configuration of a prober as an electronic device inspection apparatus according to the first embodiment of the present disclosure, and FIG. 2 is a front view of the prober. FIG. 2 is a partial sectional view, and schematically illustrates built-in components.

In FIGS. 1 and 2, the prober 10 includes an accommodation chamber 12 that accommodates a stage 11 (a placement stand) on which a carrier C (an inspection object) is placed, a loader 13 disposed adjacent to the accommodation chamber 12, and a tester 14 disposed to cover the accommodation chamber 12. The prober 10 performs inspection of electrical characteristics of an electronic device disposed on the carrier C. The accommodation chamber 12 has a shape of a hollow housing, and in addition to the stage 11, a probe card 15 is arranged inside the accommodation chamber 12 to face the stage 11. The probe card 15 has a plurality of needle-shaped probes 16 (contact terminals) arranged correspondingly to electrode pads or solder bumps which are installed correspondingly to electrodes of electronic devices disposed on the carrier C.

The carrier C is fixed to the stage 11 so that a relative position of the carrier C does not deviate with respect to the stage 11. The stage 11 is movable along a horizontal and a vertical direction. Thus, by adjusting the relative position of the carrier C with respect to the probe card 15, the electrode pads or the solder bumps installed correspondingly to the electrodes of the electronic devices are brought into contact with the probes 16 of the probe card 15. The loader 13 takes out a carrier C on which the electronic devices are disposed from a FOUP (Front Open Unified Pod) (not shown) as a transfer chamber and places the carrier C on the state 11 disposed inside the accommodation chamber 12. The loader 13 also removes a carrier C on which the inspection has been performed from the stage 11 and accommodates the inspected carrier C in the FOUP.

The probe card 15 is connected to the tester 14 via an interface 17. The probes 16 come into contact with the electrode pads or the solder bumps installed correspondingly to the electrodes of the electronic devices disposed on the carrier C, and supply power from the tester 14 to the electronic devices through the interface 17 or transmit signals from the electronic devices to the tester 14 via the interface 17.

The tester 14 has a test board (not illustrated) that emulates a part of the circuit configuration of a motherboard on which the electronic devices are mounted. The test board is connected to a tester computer 18 that determines whether the electronic devices are good or not based on the signals from the electronic devices. By replacing the test board in the tester 14, it is possible to emulate the circuit configuration of various types of motherboards.

The loader 13 includes a base unit 19 as a controller that controls a power supply or the like, and a potential difference measurement unit (measurement part) 20 that measures a potential difference in a potential difference generation circuit (not shown) (e.g., a diode, a transistor, or a resistor) for the electronic devices. The potential difference measurement unit 20 is connected to the interface 17 via a wiring 21. The potential difference measurement unit 20 acquires a potential difference between two probes 16, which are in contact with two electrode pads corresponding to the electrodes of the potential difference generation circuit, and transmits the acquired potential difference to the base unit 19. The connection structure of the probes 16 and the wiring 21 in the interface 17 will be described later with reference to FIG. 6. The base unit 19 is connected to the stage 11 via a wiring 22, and controls operation of an LED irradiation unit 30 and the like, which will be described later. Alternatively, the base unit 19 and the potential difference measurement unit 20 may be installed in the accommodation chamber 12, or the potential difference measurement unit 20 may be installed in the probe card 15.

The prober 10 further includes a user interface 23. The user interface 23 includes a display panel (e.g., a touch panel) or a keyboard, and a user inputs various pieces of information or instructions via the user interface 23.

In the prober 10, when inspecting the electrical characteristics of the electronic device, the tester computer 18 transmits data to the test board connected to the electronic device via the probes 16, and determines whether or not the transmitted data is correctly processed by the test board based on electrical signals from the test board.

Figure 3A:
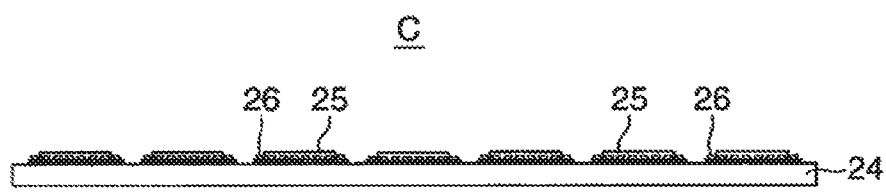
FIG. 3A is a side view schematically illustrating a configuration of a carrier for use in inspection of an electronic device using the prober of FIG. 1.
Figure 3B:
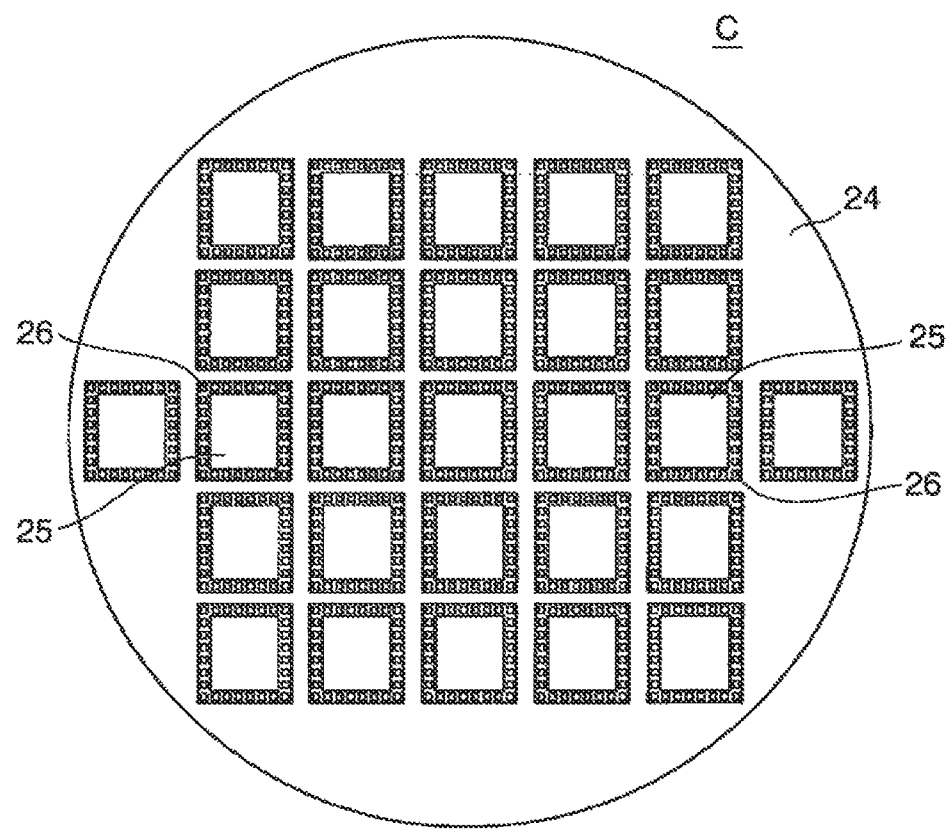
FIG. 3B is a plan view schematically illustrating a configuration of a carrier for use in inspection of an electronic device using the prober of FIG. 1.

FIGS. 3A and 3B are views schematically illustrating the configuration of the carrier for use in the inspection of an electronic device using the prober of FIG. 1, in which FIG. 3A is a side view and FIG. 3B is a plan view.

In FIGS. 3A and 3B, the carrier C is formed of a substantially disk-shaped glass substrate 24, and a plurality of electronic devices 25 cut out (diced) from a semiconductor device is arranged on the surface at predetermined intervals. In the carrier C, a plurality of electrode pads 26 are installed correspondingly to the electrodes of the electronic devices 25. By applying a voltage to each of the electrode pads 26, a current is supplied to the circuit inside each of the electronic devices 25. The shape of the glass substrate 24 of the carrier C is not limited to the substantially disk shape, and may be, for example, a substantially rectangular shape as long as the glass substrate 24 can be placed on the stage 11. Alternatively, the carrier C may be constituted by a light-transmitting member other than the glass substrate 24.

FIG. 4 is a sectional view schematically illustrating a configuration of an upper portion of the stage in FIG. 1.

In FIG. 4, the stage 11 includes a disk-shaped stage cover 27, a cooling unit (cooling mechanism) 29 in which a coolant groove is formed, and an LED irradiation unit (light irradiation mechanism) 30, which are arranged in this order from top. The stage cover 27 is in contact with the cooling unit 29 via an O-ring 31, and the coolant groove is covered by the stage cover 27 to form a coolant flow path 28. The O-ring 31 seals the coolant in the coolant flow path 28.

A colorless and light-transmitting liquid such as water or Galden (registered trademark) is used as the coolant. The coolant is supplied to the coolant flow path 28 by a pump (not illustrated) installed outside the prober 10. A flow rate control valve or the like is installed between the pump and the stage 11 so as to control the flow rate of the coolant supplied to the coolant flow path 28. The operation of the flow rate control valve or the like is controlled by the base unit 19. Both the stage cover 27 and the cooling unit 29 are formed of light-transmitting material, for example, polycarbonate, quartz, polyvinyl chloride, acrylic resin, or glass.

In the stage 11, the carrier C is placed on an upper surface of the stage cover 27, and the LED irradiation unit 30 faces the carrier C via the stage cover 27 and the cooling unit 29. The LED irradiation unit 30 has a plurality of LEDs 32, which is arranged on an upper surface of the LED irradiation unit 30 and oriented to the carrier C. The plurality of LEDs 32 is divided into a plurality of groups as described later.

Figure 5:
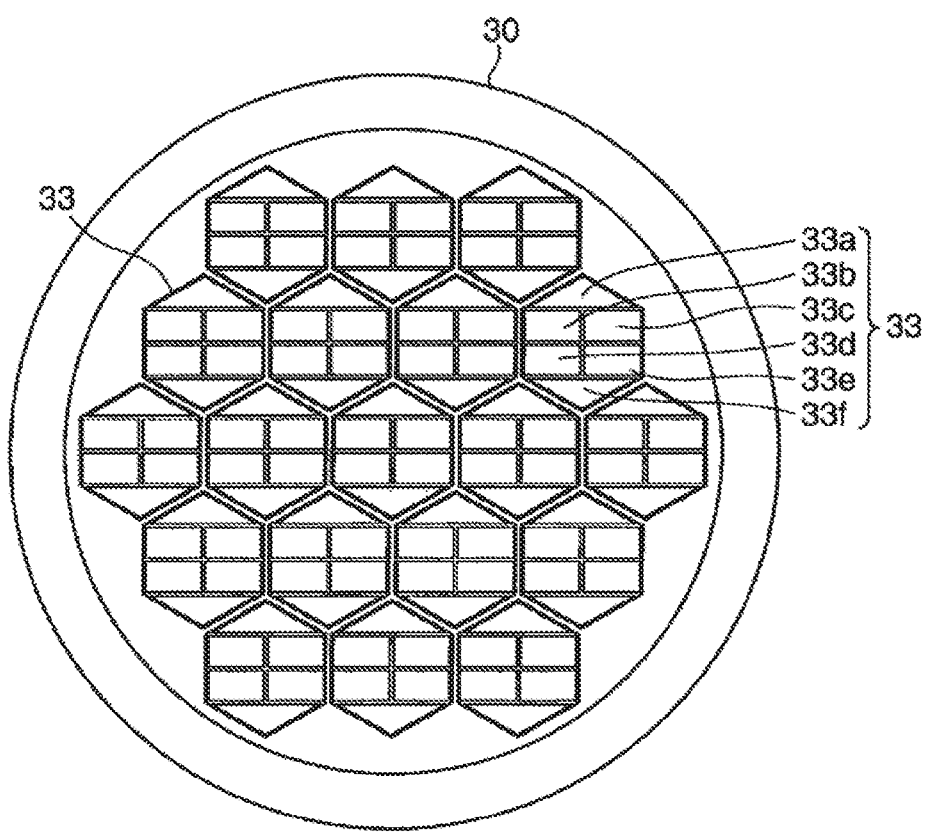
FIG. 5 is a plan view schematically illustrating a configuration of an LED irradiation unit in FIG. 4.

FIG. 5 is a plan view schematically illustrating the configuration of the LED irradiation unit in FIG. 4.

In FIG. 5, the LEDs 32 are divided into, for example, nineteen regular hexagonal sections 33, and the LEDs 32 in each of the sections 33 are divided into, for example, six LED groups 33a to 33f. That is to say, the LED irradiation unit 30 has 114 LED groups 33a to 33f. Each of the LEDs 32 irradiates LED light (e.g., near-infrared light) toward the carrier C, while the irradiation and non-irradiation of the respective LEDs 32 is controlled in the units of the LED groups 33a to 33f. Therefore, the LED irradiation unit 30 can irradiate the LED light to an arbitrary location in a rear surface of the carrier C. In FIG. 5, the LEDs 32 are not illustrated, and only the section lines of the LED groups 33a to 33f are illustrated.

In the prober 10, the inspection of the electrical characteristics of the electronic device 25 is performed by flowing the coolant is into the coolant flow path 28 as necessary and irradiating the LED light from the LED groups 33a to 33f to the carrier C. For example, when inspecting electrical characteristics of an electronic device 25 for use in a high-temperature environment (about eighty-five degrees C.), the LED light is irradiated from one of the LED groups 33a to 33f toward the desired electronic device 25, and the coolant flows into the coolant flow path 28. At this time, the LED light passes through the cooling unit 29, the coolant, the stage cover 27, and the glass substrate 24 of the carrier C. Since all of the cooling unit 29, the coolant, the stage cover 27, and the glass substrate 24 transmit light, the LED light reaches the desired electronic device 25 substantially without being attenuated and heats the desired electronic device 25 only so as to emulate the high-temperature environment. The other electronic devices 25 adjacent to the desired electronic device 25 are cooled by the coolant flowing through the coolant flow path 28. Thus, even if the temperature of the desired electronic device 25 increases due to the heating by the LED light or application of the implementation voltage, a thermal load from the desired electronic device 25 is not applied to the other electronic devices 25. In particular, since the glass substrate 24 of the carrier C has a low heat transfer coefficient, the thermal load from the desired electronic device 25 is reliably suppressed from being applied to the other electronic devices 25.

When inspecting electrical characteristics of an electronic device 25 for use in a room temperature environment (about twenty-five degrees C.), the LED light is irradiated from one of the LED groups 33a to 33f toward the desired electronic device 25 and the coolant flows into the coolant flow path 28. The intensity of the LED light irradiated toward the desired electronic device 25 is set to be weaker than the intensity of the LED light in the case of inspecting the electrical characteristics of the electronic device 25 for use in a high-temperature environment.

When inspecting electrical characteristics of an electronic device 25 for use in a low-temperature environment, the coolant flows into the coolant flow path 28, but the LED light is not irradiated from the LED irradiation unit 30 toward the carrier C. At this time, even if the temperature of the desired electronic device 25 increases due to the application of the implementation voltage, the desired electronic device 25 is immediately cooled by the coolant. Further, since the other electronic devices 25 adjacent to the desired electronic device 25 are continuously cooled by the coolant flowing through the coolant flow path 28, the other electronic devices 25 deprive heat from the desired electronic device 25. Thus, the temperature of the desired electronic device 25 can be kept at a low temperature.

In order to accurately emulate the implementation environment when inspecting the electrical characteristics of the electronic device 25 in the prober 10, it is preferable that the temperature of the desired electronic device 25 be measured in real time. In response, the present embodiment measures the temperature of the desired electronic device 25 using the potential difference measurement unit 20.

Figure 6:
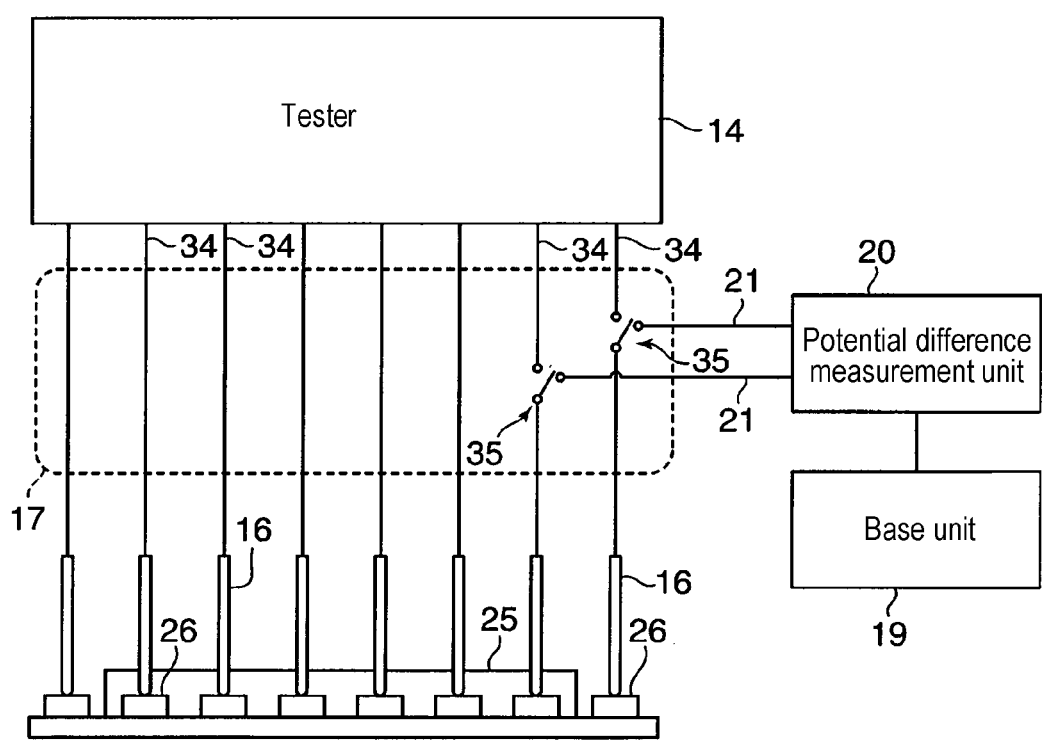
FIG. 6 is a view schematically illustrating a configuration of a circuit for measuring a temperature of an electronic device according to the first embodiment.

FIG. 6 is a view schematically illustrating a configuration of a circuit for measuring a temperature of an electronic device using the potential difference measurement unit according to the present embodiment.

In FIG. 6, the probes 16 are connected to the tester 14 via a plurality of wirings 34 arranged in the interface 17. Among the wirings 34, a relay 35 is installed in each of two wirings 34 connecting two probes 16, which are in contact with two electrode pads 26 corresponding to the electrodes of the potential difference generation circuit (e.g., a diode) in the electronic device 25, and the tester 14. Each relay 35 is configured to switchably transmit the potential of each electrode pad 26 to one of the tester 14 and the potential difference measurement unit 20. For example, when inspecting the electrical characteristics of the electronic device 25, the relays 35 transmit the potential of the electrode pads 26 to the potential difference measurement unit 20 at a predetermined timing after the implementation voltage is applied to the electrode pads 26. Here, it is known that in the potential difference, which is generated in the potential difference generation circuit, such as a diode, a transistor, or a resistor, when a predetermined current flows in the potential difference generation circuit, varies depending on temperature. Therefore, the temperature of the electronic device 25 under inspection can be measured in real time based on the potential difference of the potential difference generation circuit of the electronic device 25, that is to say, the potential difference between two electrode pads 26 (probes 16) corresponding to the electrodes of the potential difference generation circuit. In the prober 10, the potential difference measurement unit 20 acquires the potential difference of the potential difference generation circuit of the electronic device 25 based on the potential of the electrode pads 26 transmitted from the relays 35, and transmits the acquired potential difference to the base unit 19. The base unit 19 measures the temperature of the electronic device 25 based on the transmitted potential difference and the temperature characteristic of the potential difference of the potential difference generation circuit. Further, the base unit 19 adjusts the flow rate of the coolant flowing through the coolant flow path 28 and the intensity of the LED light irradiated from the LED groups 33a to 33f in the LED irradiation unit 30 based on the measured temperature of the electronic device 25. Thus, the temperature of the electronic device 25 under inspection is controlled to a desired value.

According to the prober 10, the LED irradiation unit 30 having the plurality of LEDs 32 is disposed to face the carrier C via the cooling unit 29 and the stage cover 27. Since the cooling unit 29 and the stage cover 27 are formed of light-transmitting material and the coolant flowing through the coolant flow path 28 of the cooling unit 29 also transmits light, the LED light from each of the LEDs 32 can pass through the cooling unit 29 and the stage cover 27 and reach the carrier C. In addition, the LED irradiation unit 30 can irradiate the LED light locally to the carrier C from the LED groups 33a to 33f. Thus, it possible to locally irradiate LED light to the carrier C while cooling the entirety of the carrier C by the cooling unit 29, and to heat the electronic device 25 under inspection only. That is to say, since the other electronic devices 25 in the carrier C is cooled while controlling the temperature of the electronic device 25 under inspection only, it is possible to suppress a thermal load from the electronic device 25 under inspection from being applied to the other electronic devices 25. As a result, it is possible to apply the implementation voltage to the desired electronic device 25, so that troubles that may occur when the implementation voltage is applied can be found before packaging. Thus, it is possible to prevent cost increase by suppressing deterioration of the yield of packages.

In the above-described prober 10, the carrier C is formed of the glass substrate 24, which has a low heat transfer coefficient. Therefore, it is possible to reliably suppress the thermal load from the desired electronic device 25 from being applied to the other electronic devices 25.

In addition, in the above-described prober 10, the stage cover 27, the cooling unit 29, and the coolant transmit the LED light from the respective LEDs 32, and the glass substrate 24 also transmits the LED light from the respective LEDs 32. Thus, it is possible to improve the efficiency of heating the desired electronic device 25 by the light from the respective LEDs 32.

The above-described prober 10 includes the potential difference measurement unit 20 that measures the potential difference of the potential difference generation circuit of the desired electronic device 25. Thus, it is possible to measure the temperature of the electronic device 25 under inspection in real time based on the measured potential difference. Accordingly, by performing a feedback control using the measured temperature of the electronic device 25, it is possible to accurately emulate the implementation environment during the inspection of the electronic device 25.

In the above-described prober 10, both of the stage cover 27 and the cooling unit 29 are formed of polycarbonate, quartz, polyvinyl chloride, acrylic resin, or glass, which are easily machined or molded. Thus, it is possible to reduce the manufacturing cost of the prober 10.

Next, a second embodiment of the present disclosure will be described.

The second embodiment of the present disclosure is basically the same in structure and operation as the first embodiment described above, and is only different from the first embodiment in that a wafer on which a plurality of electronic devices is formed is used instead of the carrier. Thus, descriptions of overlapping configurations and operations will be omitted, and different configurations and operations will be described below.

Figure 7A:
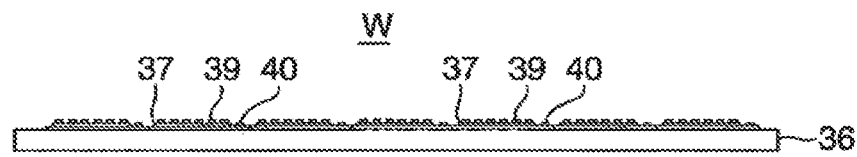
FIG. 7A is a side view schematically illustrating a configuration of a wafer for use in inspection of an electronic device according to a second embodiment of the present disclosure.
Figure 7B:
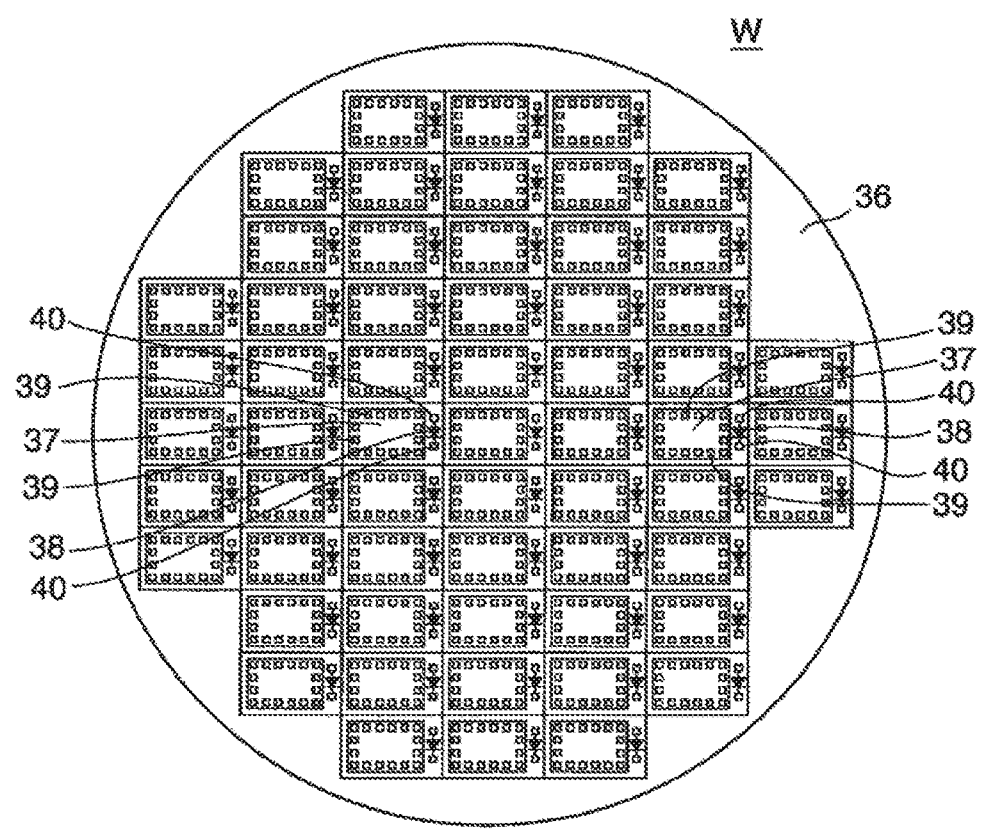
FIG. 7B is a plan view schematically illustrating a configuration of the wafer for use in inspection of an electronic device according to the second embodiment of the present disclosure.

FIGS. 7A and 7B are views schematically illustrating the configuration of a wafer for use in inspection of an electronic device in the second embodiment of the present disclosure, in which FIG. 7A is a side view and FIG. 7B is a plan view.

In FIGS. 7A and 7B, a wafer (an inspection object) W is formed of a substantially disk-shaped silicon substrate 36, and a plurality of electronic devices 37 are formed at predetermined intervals on a surface of the wafer W through etching and wiring processes. Further, in the wafer W, a potential difference generation circuit 38, such as a diode, a transistor, or a resistor, is formed beside each of the electronic devices 37. Since the potential difference generation circuit 38 is simultaneously formed with each of the electronic devices 37, the potential difference generation circuit 38 has the same quality as that of the circuit of each of the electronic devices 37. In addition, in the wafer W, a plurality of solder bumps 39 is installed correspondingly to the electrodes of the respective electronic devices 37, and two solder bumps 40 are installed correspondingly to the electrodes of each of the potential difference generation circuits 38. By applying a voltage to the solder bumps 39 and 40, a current flows in the inner circuits of the electronic devices 37 and the potential difference generation circuits 38.

FIG. 8 is a sectional view for explaining a state where the wafer W is placed on the stage according to the present embodiment.

Also in the present embodiment, in the prober 10, the inspection of the electrical characteristics of the electronic device 37 is performed by flowing the coolant into the coolant flow path 28 as necessary and irradiating the LED light from the LED groups 33q to 33f of the LED irradiation unit 30 to the wafer W. Since the silicon substrate 36 of the wafer W does not transmit LED light, in the present embodiment, it is difficult to heat a desired electronic device 37 with the LED light. However, since all of the cooling unit 29, the coolant, and the stage cover 27 transmit light, the LED light irradiated from the LED irradiation unit 30 reaches the wafer W substantially without being attenuated. Therefore, it is possible to efficiently heat the wafer W using the LED light. The wafer W is adjacent to the coolant flowing through the coolant flow path 28 with the stage cover 27 interposed between the wafer W and the coolant flow path 28. Further, since the coolant transmits the LED light, the coolant is not heated by the LED light and the temperature of the coolant does not increase. Therefore, it is possible to efficiently cool the wafer W using the coolant. That is to say, in the present embodiment, it is possible to control the temperature of the wafer W with high responsiveness when inspecting the electrical characteristics of the electronic device 37.

Figure 9:
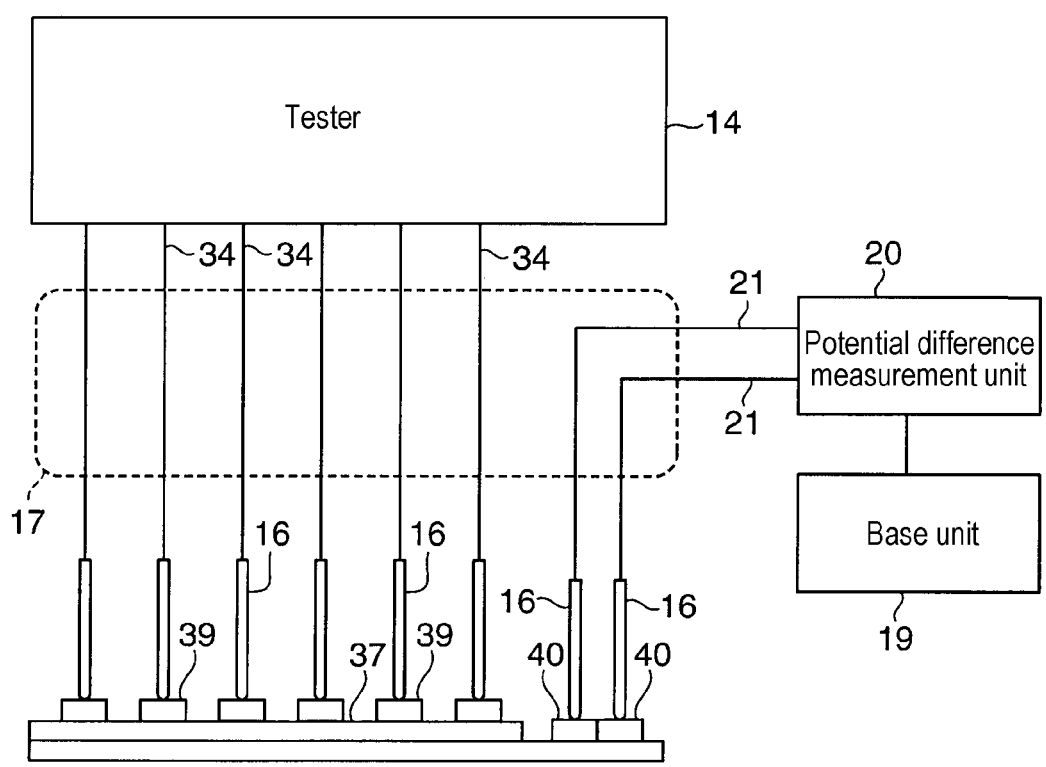
FIG. 9 is a view schematically illustrating a configuration of a circuit for measuring a temperature of an electronic device according to the second embodiment.

FIG. 9 is a view schematically illustrating a configuration of a circuit for measuring a temperature of an electronic device according to the present embodiment.

In FIG. 9, the probes 16 in contact with the solder bumps 39 are connected to the tester 14 via the plurality of wirings 34 arranged in the interface 17. The probes 16 in contact with the solder bumps 40 are connected to the wirings 21 in the interface 17, and the wirings 21 are connected to the potential difference measurement unit 20.

When inspecting the electrical characteristics of the electronic device 37 in the prober 10, the implementation voltage is applied to the solder bumps 39 and a predetermined voltage is applied to the solder bumps 40. At this time, the potential difference generation circuit 38 generates a potential difference depending on the predetermined voltage applied from the solder bumps 40. The potential difference varies depending on the temperature of the potential difference generation circuit 38 as described above. Therefore, it is possible to measure the temperature of the potential difference generation circuit 38 based on the potential difference between the solder bumps 40 corresponding to the electrodes of the potential difference generation circuit 38. In addition, since the potential difference generation circuit 38 is installed adjacent to the electronic device 37, the temperature of the potential difference generation circuit 38 may be considered substantially as the temperature of the electronic device 37. That is to say, it is possible to measure the temperature of the electronic device 37 based on the potential difference between the solder bumps 40.

In the prober 10, the potential difference measurement unit 20 acquires the potential difference of the potential difference generation circuit 38 via the wirings 21, and transmits the acquired potential difference to the base unit 19. The base unit 19 measures the temperature of the electronic device 37 based on the transmitted potential difference and the temperature characteristic of the potential difference of the potential difference generation circuit 38. Further, the base unit 19 adjusts the flow rate of the coolant flowing through the coolant flow path 28 and the intensity of the LED light irradiated from the LED groups 33a to 33f in the LED irradiation unit 30 by performing a feedback control using the measured temperature of the electronic device 37. Thus, the temperature of the electronic device 37 is controlled to a desired value. Accordingly, it possible to accurately emulate the implementation environment during the inspection of the electronic device 37.

Figure 12:
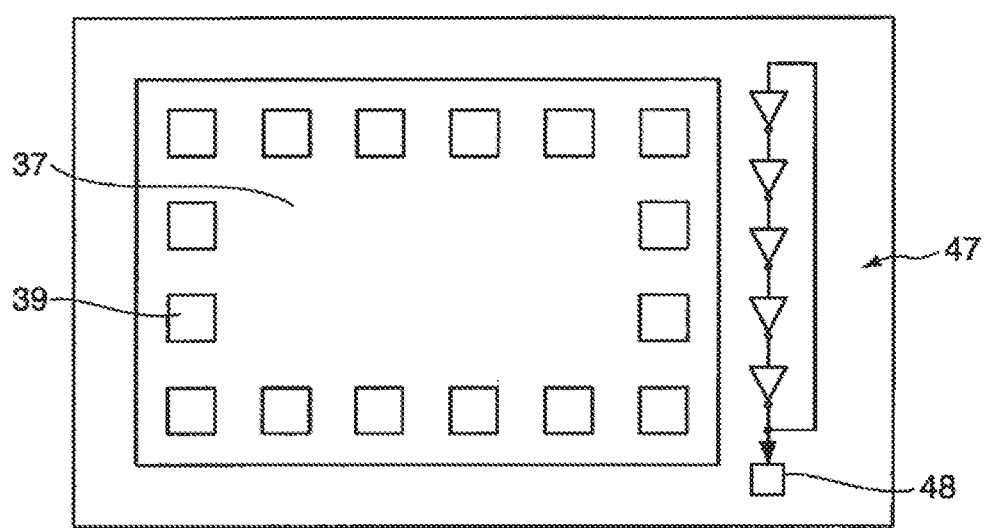
FIG. 12 is an enlarged plan view for explaining an oscillation circuit formed correspondingly to an electronic device according to the second embodiment of the present disclosure.

In the present embodiment, the potential difference generation circuit 38 is installed beside the electronic device 37 in the wafer W. However, instead of the potential difference generation circuit 38, an oscillation circuit 47 having an oscillation frequency that varies depending on temperature may be installed (see FIG. 12). As the oscillation circuit 47, for example, a ring oscillator circuit including an odd number of NOT gates (inverters) connected in a chain form is used.

In the ring oscillator circuit, the output of the NOT gate at the rearmost stage is input to the NOT gate at the foremost stage. Since each of the NOT gates has a predetermined delay time, the NOT gate at the rearmost stage outputs logical NOT, which is to be input to the NOT gate at the foremost stage, after an accumulated delay time from an input to the NOT gate at the foremost stage, and then the logical NOT is input again to the NOT gate at the foremost stage. In the ring oscillator circuit, the above-described process is repeated and a predetermined frequency is oscillated. The predetermined delay time of each of the NOT gates varies depending on temperature. As a result, the oscillation frequency of the ring oscillator circuit varies depending on temperature.

Figure 13:
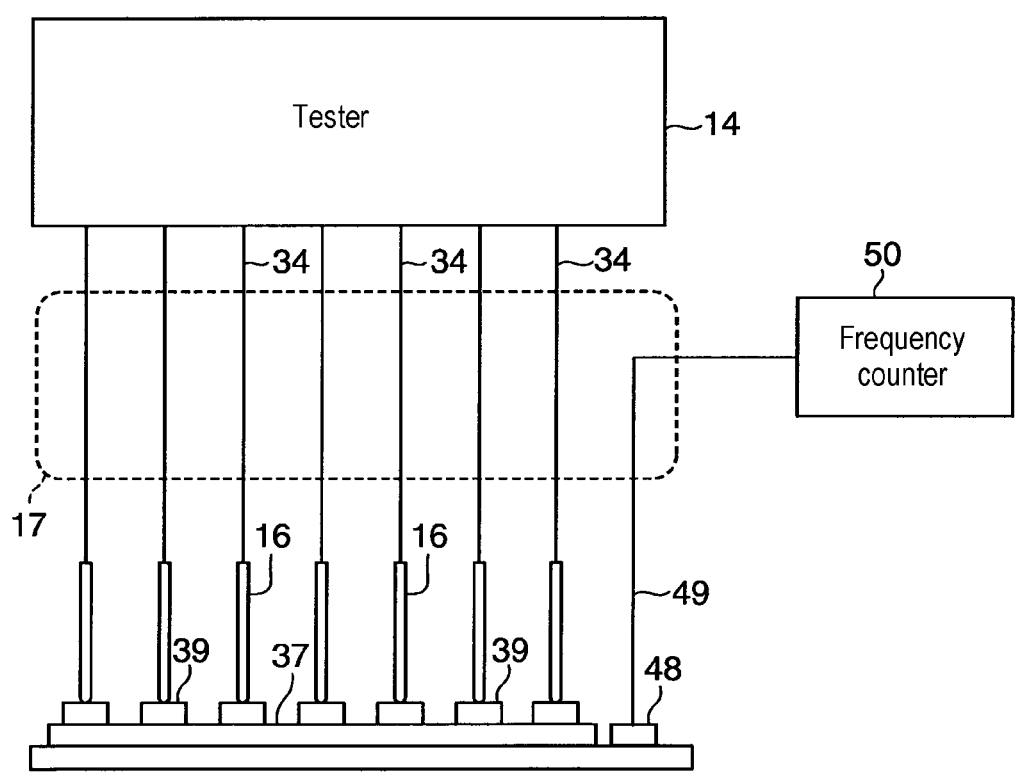
FIG. 13 is a view schematically illustrating a configuration of a modification of a circuit for measuring a temperature of an electronic device according to the second embodiment of the present embodiment.

Here, the oscillation frequency of the oscillation circuit 47 is transmitted to a terminal 48 connected to the oscillation circuit 47. In addition, as illustrated in FIG. 13, a frequency counter 50 is connected to the terminal 48 via a wiring 49, and the frequency counter 50 measures the oscillation frequency of the oscillation circuit 47 and transmits the measured frequency to the base unit 19. The base unit 19 stores in advance a relationship between the oscillation frequency and the temperature of the oscillation circuit 47 (i.e., the frequency characteristics of the oscillation circuit 47). Therefore, it is possible to measure the temperature of the oscillation circuit 47 based on the measured oscillation frequency and the frequency characteristic of the oscillation circuit 47. Since the oscillation circuit 47 is also installed adjacent to the electronic device 37 like the potential difference generation circuit 38, the temperature of the oscillation circuit 47 may be considered substantially as the temperature of the electronic device 37. That is to say, it is possible to measure the temperature of the electronic device 37 based on the oscillation frequency of the oscillation circuit 47. In particular, the ring oscillator circuit is highly reliable and inexpensive, and operates at high speed. Thus, by using the ring oscillator circuit as the oscillation circuit 47, it is possible to quickly and inexpensively measure the temperature of the electronic device 37 with high reliability.

Next, a third embodiment of the present disclosure will be described.

The third embodiment of the present disclosure is basically the same in structure and operation as those of the first embodiment and the second embodiment described above and is different from the first embodiment and the second embodiment only in the method of measuring the temperature of the electronic device 25. Thus, descriptions of overlapping configurations and operations will not be described, and different configurations and operations will be described below.

In the second embodiment, the temperature of the electronic device 37 is measured by applying a predetermined voltage to the potential difference generation circuit 38 installed beside the electronic device 37. However, since the potential difference generation circuit 38 is a fine circuit, there is a concern that the potential difference generation circuit 38 is damaged due to the voltage application. The potential difference generation circuit 38 may also function as a part of the electronic device 37. Thus, it is preferable to reduce the chance of the potential difference generation circuit 38 being damaged by the voltage application before packaging the electronic device 37. In addition, as in the electronic device 25 in the first embodiment, the potential difference generation circuit may not be installed in the electronic device in some cases. In response, in the present embodiment, the temperature of the electronic device is measured without using the potential difference generation circuit.

Figure 10:
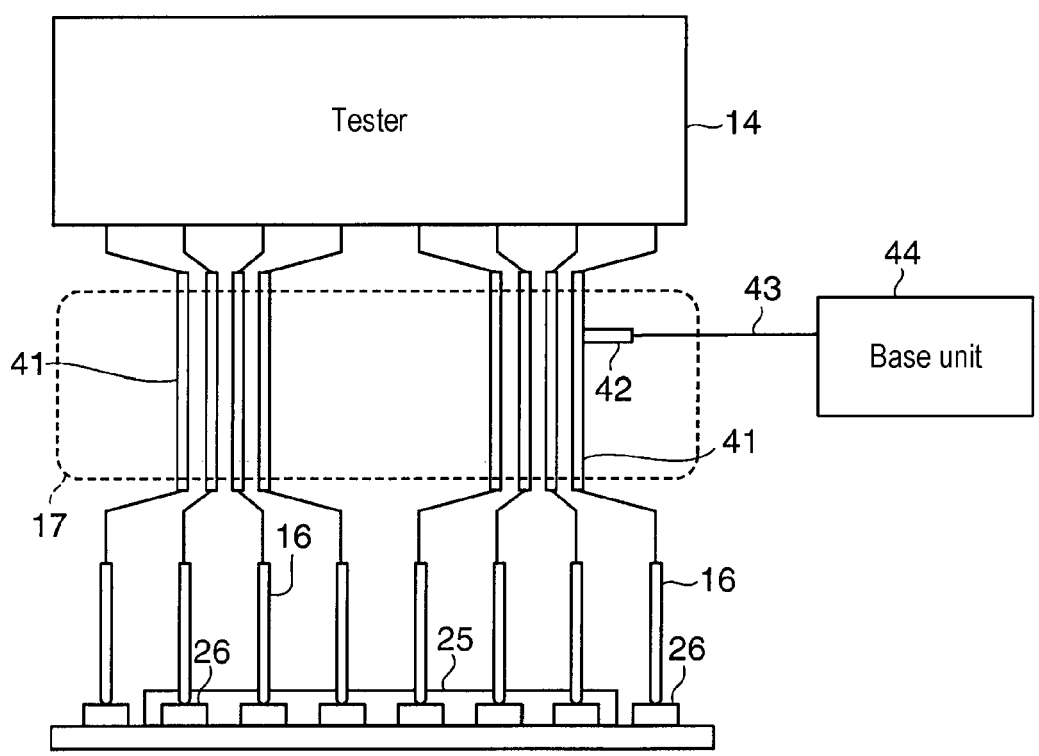
FIG. 10 is a view schematically illustrating a configuration of a circuit for measuring a temperature of an electronic device according to a third embodiment of the present embodiment.

FIG. 10 is a view schematically illustrating a configuration of a circuit for measuring a temperature of an electronic device according to the third embodiment.

Figure 11:
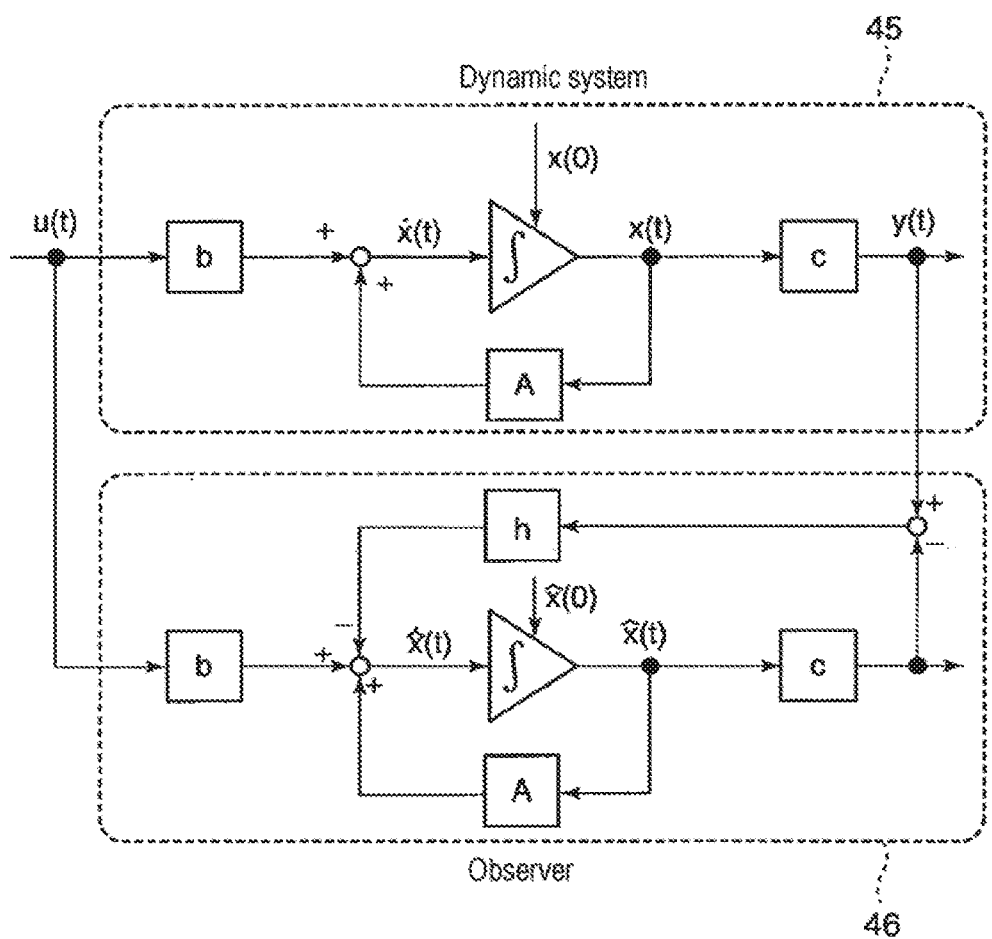
FIG. 11 is a view illustrating a configuration of an observer for measuring a temperature of an electronic device based on a temperature of a pogo pin.

In FIG. 10, the interface 17 includes a pogo pin (heat transfer members) 41, which is a bundle of a plurality of rod-shaped members connecting the tester 14 and the probes 16, and a temperature sensor 42 is attached to the pogo pin 41. The temperature sensor 42 is connected to a base unit 44 via a wiring 43, and the base unit 44 measures the temperature of the pogo pin 41. When the inspection of electrical characteristics is performed by applying the implementation voltage to the electronic device 25, the heat of the electronic device 25 is transmitted from the probes 16 to the pogo pin 41. Therefore, the temperature of the electronic device 25 has a predetermined relationship with the temperature of the pogo pin 41. Accordingly, as illustrated in FIG. 11, a state observer 46, which is a control model for measuring the temperature of the electronic device 25 as a dynamic system 45 having a heat amount of the LED light irradiated from the LED irradiation unit 30 as an input u(t) and the temperature of the pogo pin 41 as an output y(t), is constructed in the base unit 44, so that the internal state of the dynamic system 45, that is to say, the temperature of the electronic device 25, is estimated. System matrices A, b, c, and h in the observer 46 are identified, for example, by mounting a chip having a heat capacity or heat resistance similar to that of the electronic device 25 on the carrier C and measuring the temperature of the mounted chip.

In the present embodiment, it is possible to measure the temperature of the electronic device 25 under inspection in real time based on the heat amount of the LED light and the temperature of the pogo pin 41 using the observer 46. The base unit 44 adjusts the flow rate of the coolant flowing through the coolant flow path 28 and the intensity of the LED light irradiated from the LED groups 33a to 33f in the LED irradiation unit 30 based on the measured temperature of the electronic device 25. Thus, the temperature of the electronic device 25 under inspection is controlled to a desired value. Accordingly, it possible to accurately emulate the implementation environment during the inspection of the electronic device 25. Further, since it is not necessary to use the potential difference generation circuit 38 installed beside the electronic device 25 in order to measure the temperature of the electronic device 25, it is possible to prevent the potential difference generation circuit 38 from being damaged before packaging the electronic device 25 and to prevent deterioration of the yield of packages.

In the present embodiment, the temperature sensor 42 is attached to the pogo pin 41, but the temperature sensor 42 may be attached to the probe 16 and the wiring (heat transfer member) to which the heat of the electronic device 25 is transferred. Even in this case, an observer having the heat amount of the LED light as the input u(t) and the temperature of the probe 16 or the wiring as the output y(t) is constructed in the base unit 44, and the temperature of the electronic device 25 can be measured based on the heat amount of the LED light and the temperature of the probe 16 or the wiring using the observer.

Although the present disclosure has been described with reference to the embodiments described above, the present disclosure is not limited to the above-described embodiments.

For example, in the stage 11, the stage cover 27 is formed of light-transmitting material. However, the stage cover 27 may be formed of material having a high heat transfer coefficient other than the light-transmitting material, for example, a metal such as Al or Cu, a ceramic such as SiC, or a composite material of metal and ceramic. In this case, the stage cover 27 does not transmit the LED light, but the LED light irradiated by the LED irradiation unit 30 passes through the cooling unit 29 and the coolant. Thus, the LED light reaches the stage cover 27 substantially without being attenuated. Therefore, it is possible to efficiently heat the stage cover 27 using the LED light, and thus it is also possible to efficiently heat the wafer W placed on the stage cover 27. When the stage cover 27 is formed of quartz, cracks and the like may occur in the stage cover 27 because quartz does not have high rigidity. However, by forming the stage cover 27 using a metal, it is possible to enhance the rigidity of the stage cover 27 and to prevent cracks and the like from occurring in the stage cover 27. Particularly, since it is necessary for the material of the stage cover 27 to have physical properties of high thermal conductivity and high Young's modulus securing high rigidity, a composition material of Cu or SiC and diamond (e.g., THERMADITE (registered trademark) 100-60 (manufactured by II-VIM Cubed Technologies Inc.)) may be suitably used, whereby it is possible to realize the stage cover 27 to be thin in thickness and have high thermal conductivity.

In addition, by adjusting the flow rate of the coolant supplied to the coolant flow path 28 of the stage 11, it is possible to change the controllable range of the temperature of the electronic devices 25 and 37 to a high-temperature side or a low-temperature side. For example, when changing the controllable range of the temperature of the electronic devices 25 and 37 to the high-temperature side, the flow rate of the coolant supplied to the coolant flow path 28 is decreased. When changing the controllable range of the temperature of the electronic devices 25 and 37 to the low-temperature side, the flow rate of the coolant supplied to the coolant flow path 28 is increased. In addition, it is possible to adjust a heat transfer amount between the electronic devices 25 and 37 and the coolant by forming the surface (coolant contact surface) of the stage cover 27 facing the coolant flow path 28 to have a fin shape in which a plurality of fins is arranged, or by adjusting the surface roughness of the coolant contact surface of the stage cover 27. Therefore, it is also possible to change the controllable range of the temperature of the electronic devices 25 and 37 by changing the shape of the coolant contact surface of the stage cover 27.

The above-described embodiments have been described with the case where the present disclosure is applied to the stage 11 of the prober 10, which inspects the electronic device 25 or 37 in a single wafer W or carrier C. However, the present disclosure may be also applied to a stage disposed together with a probe card in each inspection chamber in a multi-chamber type electronic device inspection apparatus including a plurality of inspection chambers (cells).

This application is based on and claims priority from Japanese Patent Application No. 2016-231844 filed on Nov.

29, 2016, Japanese Application No. 2017-54366 filed on Mar. 21, 2017, and Japanese Patent Application No. 2017-135401 filed on Jul. 11, 2017, the disclosures of which are incorporated in the present application in their entirety by reference.

EXPLANATION OF REFERENCE NUMERALS

C: carrier, W: wafer, 10: prober, 11: stage, 15: probe card, 16: probe, 20: potential difference measurement unit, 24: glass substrate, 25, 37: electronic device, 26: electrode pad, 27: stage cover, 28: coolant flow path, 29: cooling unit, 30: LED irradiation unit, 32: LED, 33a to 33f: LED group, 35: relay, 36: silicon substrate, 38: potential difference generation circuit, 39, 40: solder bump, 47: oscillation circuit, 50: frequency counter

What is claimed is:

1. A placement stand comprising:
a cooling mechanism on which an inspection object is placed; and
a light irradiation mechanism disposed to face the inspection object across from the cooling mechanism,
wherein the cooling mechanism is formed of light-transmitting material, and a coolant transmitting light flows in the cooling mechanism,
wherein the light irradiation mechanism includes a plurality of LEDs oriented to the inspection object,
wherein irradiation and non-irradiation of the plurality of LEDs are partially controlled to irradiate light to an arbitrary location in the inspection object such that the arbitrary location in the inspection object is heated while the entirety of the inspection object is cooled by the cooling mechanism,
wherein the plurality of LEDs is divided into a plurality of LED groups, and
wherein the irradiation and the non-irradiation of each of the plurality of LEDs are controlled in units of the LED groups.

2. The placement stand of claim 1, wherein the inspection object is formed of a glass substrate on which a plurality of electronic devices is disposed.

3. The placement stand of claim 1, wherein the inspection object is formed of a semiconductor wafer on which a plurality of electronic devices is formed.

4. The placement stand of claim 1, wherein the light-transmitting material includes polycarbonate, quartz, polyvinyl chloride, acrylic resin, or glass.

5. The placement stand of claim 1, wherein each of the plurality of LEDs irradiates near-infrared light.

6. The placement stand of claim 1, wherein the entirety of a portion in the cooling mechanism facing the inspection object is formed of the light-transmitting material.

7. An electronic device inspection apparatus for inspecting an electronic device disposed on or formed on an inspection object, the apparatus comprising:
a placement stand on which the inspection object is placed; and
a contact terminal in electrical contact with the electronic device of the inspection object placed on the placement stand,
wherein the placement stand further comprises:
a cooling mechanism on which the inspection object is placed; and
a light irradiation mechanism disposed to face the inspection object across from the cooling mechanism,
wherein the cooling mechanism is formed of light-transmitting material, and a coolant transmitting light flows in the cooling mechanism,
wherein the light irradiation mechanism includes a plurality of LEDs oriented to face the inspection object,
wherein irradiation and non-irradiation of the plurality of LEDs are partially controlled to irradiate light to an arbitrary location in the inspection object such that the arbitrary location in the inspection object is heated while the entirety of the inspection object is cooled by the cooling mechanism,
wherein the plurality of LEDs is divided into a plurality of LED groups,
wherein the irradiation and the non-irradiation of each of the plurality of LEDs are controlled in units of the LED groups.

8. The electronic device inspection apparatus of claim 7, wherein the inspection object is formed of a glass substrate on which a plurality of electronic devices are disposed, and
wherein the electronic device inspection apparatus further includes a measurement part that measures a potential difference of a potential difference generation circuit of the electronic device.

9. The electronic device inspection apparatus of claim 8, wherein the potential difference generation circuit includes a diode, a transistor, or a resistor.

10. The electronic device inspection apparatus of claim 7, wherein the inspection object is formed of a semiconductor wafer on which a plurality of electronic devices is formed, and a potential difference generation circuit is installed beside each of the electronic devices, and
wherein the electronic device inspection apparatus further comprises a measurement part that measures a potential difference of the potential difference generation circuit.

11. The electronic device inspection apparatus of claim 7, further comprising a temperature sensor that measures a temperature of a heat transfer member to which heat of the electronic device is transferred,
wherein a temperature of the electronic device is estimated based on the temperature measured by the temperature sensor.

12. The electronic device inspection apparatus of claim 11 further comprising an observer that estimates an internal state of a dynamic system having a heat amount of light irradiated from the light irradiation mechanism as an input and the temperature measured by the temperature sensor as an output,
wherein the observer estimates the temperature of the electronic device as the internal state of the dynamic system.

13. The electronic device inspection apparatus of claim 7, wherein the inspection object is formed of a semiconductor wafer on which a plurality of electronic devices is formed, and an oscillation circuit is installed beside each of the electronic devices, and
wherein the electronic device inspection apparatus further comprises a measurement part that measures an oscillation frequency of the oscillation circuit.

14. The electronic device inspection apparatus of claim 13, wherein the oscillation circuit includes a ring oscillator.

15. The electronic device inspection apparatus of claim 7, wherein the entirety of a portion in the cooling mechanism facing the inspection object is formed of the light-transmitting material.

* * * * *